(12) United States Patent
Lewicki

(10) Patent No.: US 6,191,648 B1
(45) Date of Patent: Feb. 20, 2001

(54) SWITCHED-CAPACITOR COSINE FILTER CIRCUIT

(75) Inventor: Laurence Douglas Lewicki, Sunnyvale, CA (US)

(73) Assignee: National Semiconductor Corporation, Santa Clara, CA (US)

(*) Notice: Under 35 U.S.C. 154(b), the term of this patent shall be extended for 0 days.

(21) Appl. No.: 09/294,635

(22) Filed: Apr. 19, 1999

(51) Int. Cl.[7] ....................................................... H03K 5/00
(52) U.S. Cl. .......................... 327/554; 327/337; 327/558; 333/173; 330/9
(58) Field of Search .............................. 327/554, 94, 337, 327/552, 558; 330/9; 333/172, 173; 341/143

(56) References Cited

U.S. PATENT DOCUMENTS

| | | | |
|---|---|---|---|
| 4,329,599 | * 5/1982 | Gregorian et al. | 327/554 |
| 5,283,578 | * 2/1994 | Ribner et al. | 341/143 |
| 5,477,481 | 12/1995 | Kerth | 364/825 |

OTHER PUBLICATIONS

IEEE International Solid–State Circuits Conference, Session 20/RF/Baseband Processing/Paper FP 20.3, "Analog Baseband Processor for CDMA/FM Portable Cellular Telephones", Feb. 17, 1995, pp. 328–329.

Hsieh, Kuo–Chiang et al., "A Low–Noise Chopper–Stabilized Differential Switched–Capacitor Filtering Technique", pp. 243–250.

* cited by examiner

Primary Examiner—Dinh T. Le
(74) Attorney, Agent, or Firm—Baker & McKenzie

(57) ABSTRACT

A switched-capacitor cosine filter circuit includes a differential amplifier and a switched-capacitor circuit. A set of control signals cause the switched-capacitor circuit to selectively couple the inputs and output of the differential amplifier thereby producing a switched input signal for the differential amplifier. During alternating states of the control signals, the switched-capacitor cosine filter circuit samples the input signal as a noninverting and inverting integrator circuit.

22 Claims, 6 Drawing Sheets

SWITCHED-CAPACITOR COSINE FILTER CIRCUIT

BACKGROUND OF THE INVENTION

1. Field of the Invention

The present invention relates to cosine filter circuits, and in particular, to switched-capacitor cosine filter circuits.

2 Description of the Related Art

Cellular telephones typically operate in a standby mode in which most active receiver circuitry is powered up, or enabled, only long enough to detect the presence of an incoming call. This so-called "power-up" time is typically in the range of 20 percent. Added to this 20 percent "power-up" time is the overhead time needed to initialize the system, e.g., the time needed to achieve phase lock within the phase lock loops of the system and to compensate for receiver circuit offsets. Hence, if the overhead time is 5 percent, then the average power dissipation during standby mode has increased by 25 percent (0.25/0.2=1.25). Accordingly, it follows that if the overhead time can be reduced then the average power dissipation during standby operation can also be reduced. For example, one conventional CDMA (code division multiple access) spread spectrum cellular system has a typical overhead time of approximately four milliseconds (ms), and it has been a goal to reduce such overhead time by a factor of four to approximately 1 ms.

Referring to FIG. 1, cellular telephones, as with most communication systems, require high gain baseband filters within the receive signal path. In such applications, the in-band signal is amplified and conveyed to subsequent stages for processing, e.g., to an analog-to-digital converter (ADC). This analog filtering serves two purposes: reducing the magnitude of interfering signals outside the band of interest; and providing anti-aliasing. With respect to the former purpose, reducing the magnitude of interfering signals outside of the band of interest prevents large out-of-band signals from reducing the dynamic range of the system. However, it is important that the power dissipated within the filter be less than the power that would be required for an ADC with sufficient resolution to handle such out-of-band interference. For example, if the out-of-band interference is 40 decibels (dB) higher than the in-band signals, the resolution of the ADC, without such filtering, would increase from four bits to 11 bits.

Referring to FIG. 2, and with respect to the latter purpose, providing anti-aliasing is achieved by causing the frequency selectivity of the filter to reduce the magnitude of signals beyond the Nyquist rate of the ADC to prevent such signals from "aliasing" back into the passband as a result of the sampling process and thereby further reducing the dynamic range.

The DC offsets in the receive signal path cause performance of the system to degrade in at least two ways. Offsets near the front end of the system get amplified by the active filter circuit and thereby reduce the available dynamic range of the ADC at the output. Additionally, referring to FIG. 3, offsets create errors in the two receiver signal paths commonly referred to as "in-phase" (I) and "quadrature" (Q) signal paths, thereby creating constellation distortion. The magnitude of the error E equals the difference between the ideal I and Q signal vectors. These errors decrease the available signal-to-noise (SNR) ratio, thereby further reducing the system performance. For example, in one conventional type of cellular telephone, the receiver input data is encoded using quadrature phase shift keying (QPSK). The offsets create an error vector E which causes the constellation points to shift. (The ideal constellation vectors are identified by dashed lines, while the actual resultant constellation vectors are identified with bold lines.) The magnitude of the error vector is computed according to Equation (1).

$$|E| = \sqrt{V_{OS_I}^2 + V_{OS_Q}^2} \cong 2 \cdot \sqrt{V_{OS_{MAX}}} \quad (1)$$

In one typical cellular telephone receiver, the four-bit ADC within the received signal path operates with a nominal peak-to-peak signal range of 12 digital counts. A maximum offset of one LSB (least significant bit) results in an error vector of 17 percent. Accordingly, in order to reduce this error to 10 percent, it is necessary that the offset be kept to less than one LSB.

Referring to FIG. 4, offset within the quadrature signal paths has been removed in conventional systems by using a low frequency feedback loop to cancel such offset component In a conventional CDMA spread spectrum cellular telephone system, for example, the baseband information bandwidth extends from one to 630 kilohertz (kHz). So as to not attenuate the low frequency baseband information, the offset cancellation loop bandwidth must be kept well below 1 kHz. So as to maintain signal integrity, low frequency phase response and group delay matching between the I and Q channels is just as important as magnitude matching. The offset cancellation loop bandwidth is typically set to approximately 100 hertz (Hz) to satisfy such requirements.

This conventional design provides offset compensation feedback by way of a pulse density modulated (PDM) output signal generated by a modulator/demodulator (MODEM) chip. This digital signal is filtered by a first order resistive-capacitive (RC) network. The output of this filter is fed into the analog receive filter with a nominal gain of −50% full scale for every +1 volt change in the control voltage. In the worst of cases, the offset values for the transconductive-capacitive (gm-C) filters used in conventional systems are approximately 50%/G of full scale, e.g., eight counts of a four-bit ADC. As a result of this large potential initial offset error, these loops can take up to 4 ms to converge within 0.5 LSB (2.5 time constants of a 100 Hz filter).

SUMMARY OF THE INVENTION

A circuit containing an embodiment of the present invention provides an offset compensation technique for high gain switched capacitor filters, such as those providing a voltage gain of at least 30 dB, thereby reducing bit error rates caused by such offsets in digital communication systems. Chopper stabilization is used in the amplifier within the filter to reduce offsets. The signal, or tone, at the chopper signal frequency is filtered out with a switched capacitor filter having a cosine filter response. Such a combination of chopper stabilization and switched capacitor cosine filtering virtually eliminates offsets without creating extraneous frequency components in the output of the high gain filter circuit.

In accordance with one embodiment of the present invention, a switched-capacitor cosine filter circuit includes inverse and noninverse signal input terminals, a differential amplifier, a switched-capacitor feedback circuit and a switched-capacitor input circuit. The inverse and noninverse signal input terminals are configured to convey inverse and noninverse phases of a differential input signal, respectively. The differential amplifier includes first and second input terminals and at least one output terminal configured to receive first and second input signals and in accordance therewith provide an output signal, respectively. The switched-capacitor feedback circuit is coupled between the at least one output terminal and the first and second input terminals and is configured to receive a plurality of control signals and in accordance therewith capacitively couple the at least one output terminal to the first input terminal. The switched-capacitor input circuit is coupled between the inverse and noninverse signal input terminals and the first and second input terminals and is configured to receive a portion of the plurality of control signals and in accordance therewith capacitively couple the inverse and noninverse signal input terminals and the first and second input terminals. During a first state of the plurality of control signals., the switched-capacitor cosine filter circuit samples the inverse and noninverse differential input signal phases as a noninverting integrator circuit, and during a second state of the plurality of control signals, the switched-capacitor cosine filter circuit samples the inverse and noninverse differential input signal phases as an inverting integrator circuit.

In accordance with another embodiment of the present invention, a switched-capacitor cosine filter circuit includes a switched-capacitor circuit and a differential amplifier. The switched-capacitor circuit is configured to receive a plurality of control signals and in accordance therewith receive and capacitively couple a differential input signal and an output signal and in accordance therewith provide a switched input signal. The differential amplifier is coupled to the switched-capacitor circuit and is configured to receive the switched input signal and in accordance therewith provide the output signal. During a first state of the plurality of control signals, the switched-capacitor cosine filter circuit samples the differential input signal as a noninverting integrator circuit, and during a second state of the plurality of control signals, the switched-capacitor cosine filter circuit samples the differential input signal as an inverting integrator circuit.

These and other features and advantages of the present invention will be understood upon consideration of the following detailed description of the invention and the accompanying drawings.

DETAILED DESCRIPTION OF THE INVENTION

Figure 5:
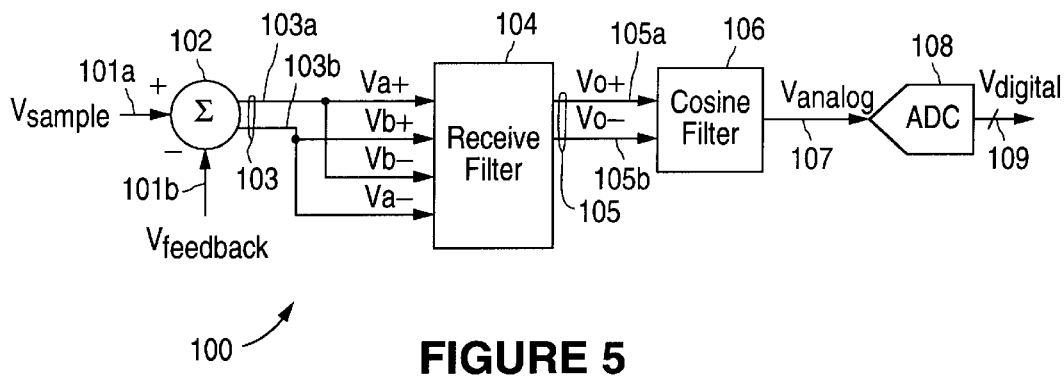
FIG. 5 is a functional block diagram of a signal filter circuit in which the present invention is suitable for use.

Referring to FIG. 5, a switched capacitor filter circuit 100 implemented in accordance with one embodiment of the present invention includes a signal summing circuit 102, a receive filter circuit (with gain) 104, a cosine filter circuit 106 and an ADC circuit 108. The sampled data signal 101a is received and differentially summed with a feedback signal 101b by subtracting the feedback signal 101b from the data signal 101 a. A differential summation signal 103 is provided with noninverse 103a and inverse 103 b signal phases. These signals 103a, 103b are amplified and filtered by the receive filter stage 104 to produce a differential output voltage 105 with noninverse 105a and inverse 105b signal phases. The cosine filter stage 106 filters the signals 105a, 105b and produces a filtered analog signal 107 which is then converted to a digital signal 109 by the ADC 108. (The receive filter 104 and cosine filter 106 stages are discussed in more detail below.)

Figure 6:
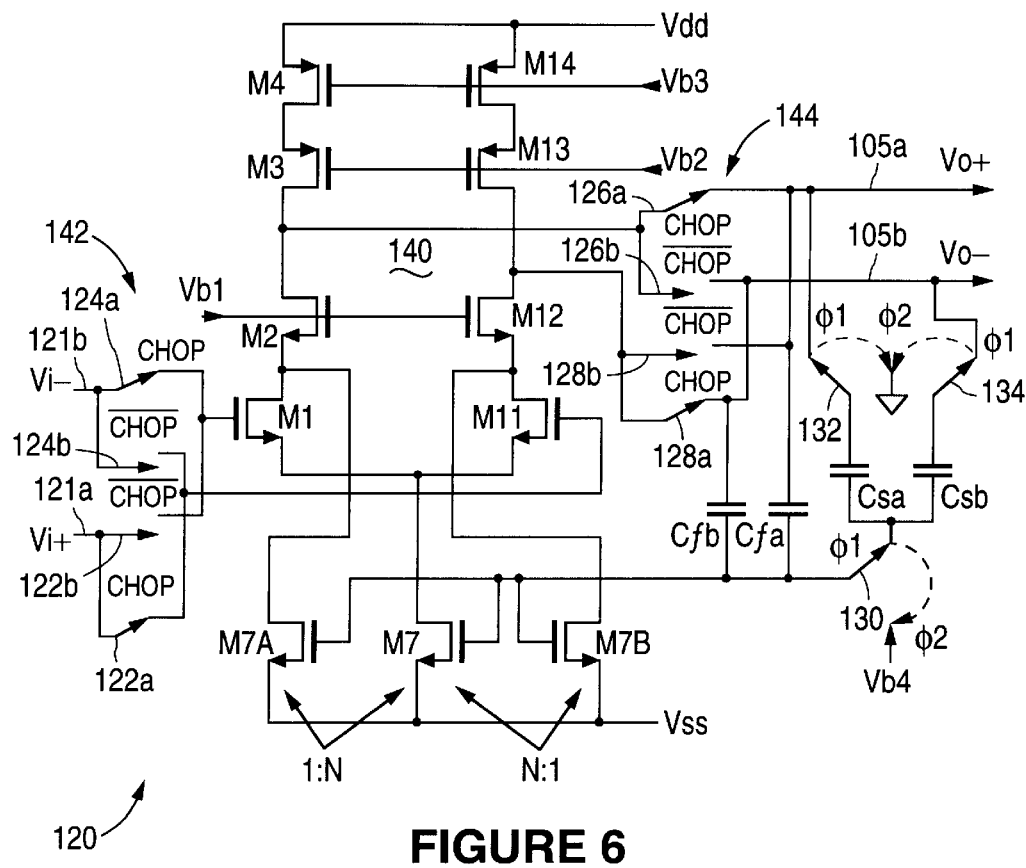
FIG. 6 is a schematic diagram of a chopper-stabilized telescopic differential amplifier circuit suitable for use with the present invention.

Referring to FIG. 6, the receive filter stage 104 includes a chopper-stabilized telescopic differential amplifier circuit 120. Among known fully differential operational amplifier designs, so-called telescopic, or unfolded cascode, amplifiers are known to have a high bandwidth-to-power ratio, albeit at the cost of a somewhat more complicated biasing requirement due to the smaller common mode signal range at the input as compared to the output. However, the reduced common mode input signal range does not present a significant problem for switched capacitor integrators, and any disadvantages of the more complex bias circuitry are generally offset by the reduced power dissipation of the telescopic amplifier design.

Chopper stabilization is achieved by providing switches at both the input and output terminals of the amplifier 120. These switches act as multiplexors to alternate which branch of the differential amplifier is connected to the inverting and noninverting input and output terminals.

The actual differential amplifier 140 includes two circuit branches: PMOS transistors M3 and M4 and NMOS transistors M1 and M2 form one branch; PMOS transistors M13 and M14 and NMOS transistors M11 and M12 form the second branch. Both circuit branches are biased by NMOS transistors M7, M7A and M7B. Transistor M7 is sized to be N-times larger than each of transistors M7A and M7B. Transistor M7 provides biasing for both branches of the differential amplifier 140, while transistor M7A provides a trickle bias for transistors M2, M3 and M4 when transistor M1 is turned off, and transistor M7B provides a trickle bias for transistors M12, M13 and M14 when transistor M11 is turned off. This improves the signal settling characteristics of the differential amplifier 140 in at least two ways.

First, the drain currents of transistors M7A and M7B maintain a bias for signal path cascode transistors M2 and M12, respectively, even when their respective input transistors M1 and M11 are turned off during slewing. This minimizes recovery time problems that may otherwise occur if the cascode transistors M2, M12 were allowed to be turned off completely. Second, common mode feedback is provided through transistors M7A and M7B even when the input transistors M1 and M11, respectively, are turned off during slewing. If common mode feedback were only available to one side of the amplifier at one time, it would result in a differential signal error that would increase the amplifier settling time. (Additional description of this trickle biasing technique and advantages it provides can be found in commonly owned, co-pending U.S. patent application Ser. No. 08/772,011, entitled "High Speed Fully Differential Operational Amplifier With Fast Settling Time for Switched Capacitor Applications," the disclosure of which is incorporated herein by reference.)

A set 142 of input signal switches 122a, 122b, 124a, 124b is connected between the noninverting 121a and inverting 121b input terminals and the gate terminals of transistors M1 and M11. A set 144 of output signal switches 126a, 126b, 128a, 128b is connected between the drain terminals of transistors M2 and M12 and the noninverting 105a and inverting 105b output terminals. During the time period that the chop signal CHOP is asserted (and $\overline{\text{CHOP}}$ is not asserted), the noninverting 121a and inverting 121b input terminals are connected to the gate terminals of transistors M11 and M1, respectively, and the noninverting 105a and inverting 105b output terminals are connected to the drain terminals of transistors M2 and M12, respectively. Conversely, during the time period that signal $\overline{\text{CHOP}}$ is asserted (and signal CHOP is not asserted) the noninverting 121a and inverting 121b input terminals are connected to the gate terminals of transistors M1 and M11, respectively, and the noninverting 105a and inverting 105b output terminals are connected to the drain terminals of transistors M12 and M2, respectively.

Figure 7:
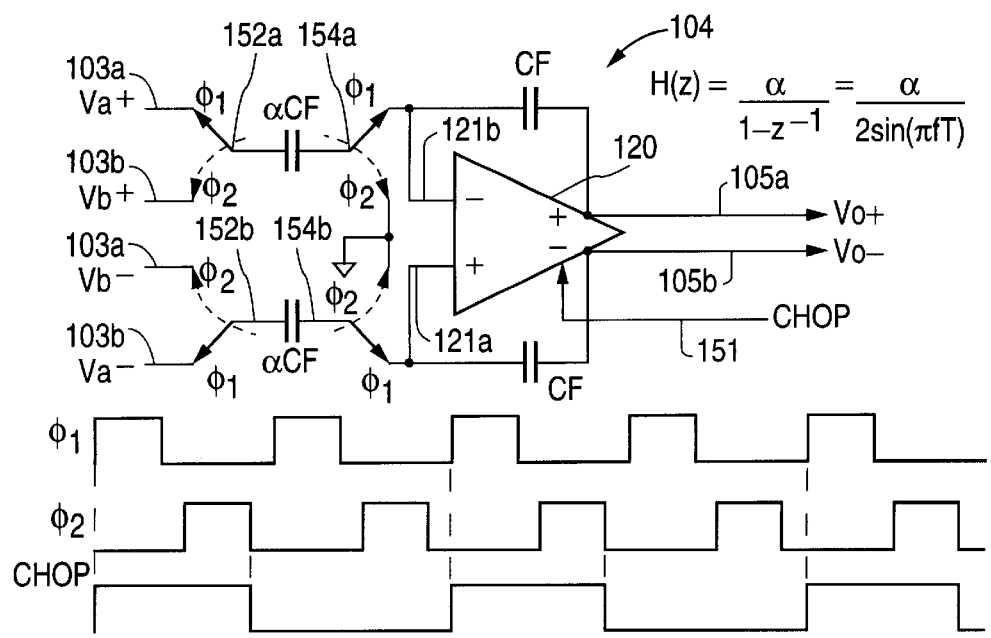
FIG. 7 is a schematic diagram and associated signal timing diagram for a switched capacitor integrator circuit in which the amplifier circuit of FIG. 6 is suitable for use.
Figure 8A:
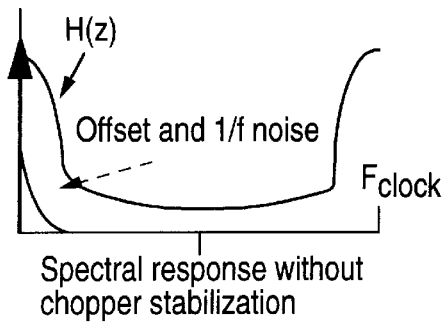
FIG. 8 is a series of spectral response diagrams for the circuit of FIG. 7 when used with a cosine filter stage.
Figure 8B:
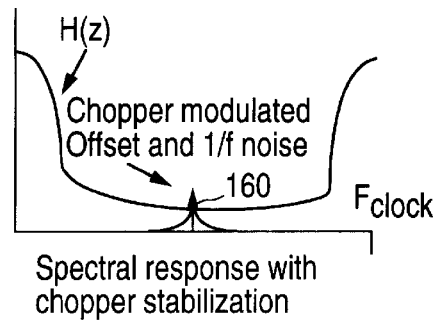
Figure 8C:
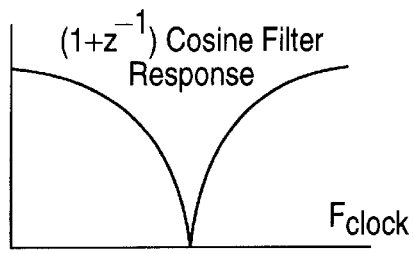
Figure 8D:
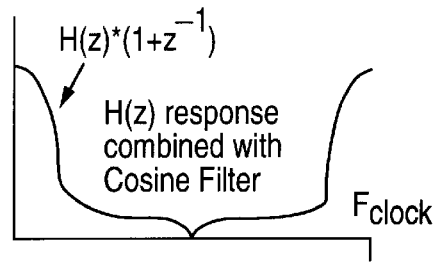

During the initial portions of the asserted states of signals CHOP and $\overline{\text{CHOP}}$, another signal $\phi 1$ is asserted, while during the last portions of signals CHOP and $\overline{\text{CHOP}}$, yet another control signal 42 is asserted. The asserted signal states of these control signals $\phi 1$, $\phi 2$ are mutually exclusive in time and nonoverlapping. (These signals are illustrated in FIG. 7.) Accordingly, during the initial portions of the CHOP and $\overline{\text{CHOP}}$ signals, common mode capacitive feedback between the output terminals 105a, 105b and the biasing transistors M7, M7A, M7B is provided by capacitors Cfa and Csa and capacitors Cfb and Csb. During the last portions of the CHOP and $\overline{\text{CHOP}}$ signals, capacitors Csa and Csb are discharged and capacitors Cfa and Cfb are precharged by a bias voltage Vb4. (Bias voltages Vb1, Vb2, Vb3 and Vb4 can be generated using conventional replica bias circuit techniques, such as diode-connected transistors driven by current sources.)

Therefore, as the amplifier circuit 120 changes from the CHOP state to the $\overline{\text{CHOP}}$ state, the compensation capacitors Cfa, Cfb. Csa, Csb are effectively disconnected from the output terminals 105a, 105b. Hence, the slewing of the circuit 120 becomes very fast and is limited substantially only by the parasitic capacitances present at the drain terminals of output transistors M2 and M12. Accordingly, due to such fast slewing, the chopped amplifier circuit 120 exhibits virtually no residual memory of the preceding CHOP clock state.

Referring to FIG. 7, one embodiment of the receive filter circuit 104 (FIG. 5) can be implemented as a switched capacitor integrator circuit using a chopper-stabilized telescopic differential amplifier circuit 120 (FIG. 6) with feedback capacitors CF and switched input capacitors αCF. This circuit 104 is switched using a clock signal with two nonoverlapping phases $\phi 1$, $\phi 2$ which, as discussed above, are also used in the differential amplifier circuit 120. This switched capacitor technique reduces signal-dependent charge injection effects.

During clock phase $\phi 1$, the noninverse 103a and inverse 103b phases of the summation signal 103 (FIG. 5) are capacitively coupled through the input capacitors αCF to the inverting 121 b and noninverting 121 a terminals, respectively, of the differential amplifier circuit 120. During clock signal phase $\phi 2$, the noninverse 103a and inverse 103b signals are capacitively coupled to circuit ground.

Referring to FIG. 8, the effects of this switched-capacitor integration is represented. As shown in graphs (A) and (B), as a result of the chopper stabilization of the switched capacitor integrator circuit 104, the DC offset, as well as the 1/f noise, of the operational amplifier 120 is modulated up to the frequency of the chopping signal CHOP. Qualitatively, this chopper stabilization causes the offset of the operational amplifier 120 to appear as a square wave at the output terminals 105a, 105b of the amplifier 120. This square wave has an amplitude which is proportional to the product of the original, i.e., non-chopped, operational amplifier offset and the switched-capacitor filter magnitude response at the fundamental frequency of the chopping signal CHOP. The frequency of this square wave is equal to the frequency of the chopping signal CHOP. Accordingly, notwithstanding the reduced magnitude of this signal component 160 due to the filtering action of the switched-capacitor integrator circuit 104, such signal component 160 can still cause problems later in this system if left unfiltered.

Referring to graphs (C) and (D), one way to eliminate this unwanted signal component 160 is to use a cosine filter circuit with a sampling rate which is synchronized to the chopper stabilization signal CHOP. Doing so will cause this signal component 160 to be "notched" out due to the narrow bandstop filter characteristics of the cosine filter response. This filtering action can be represented by Equation (2).

$$\left| \frac{(1+z^{-1})}{2} \right| = \cos\left(\frac{\pi \cdot f_{signal}}{F_{clock}}\right) \equiv 0 \text{ if } f_{signal} = \frac{F_{signal}}{2} \qquad (2)$$

Since the frequency of the chopping signal CHOP is set equal to one-half of the clock frequency ($F_{clock}/2$), the spurious filter output due to the modulated DC offset (and 1/f noise) will be nulled out if the filter is convolved with $(1+z^{-1})$.

Figure 9:
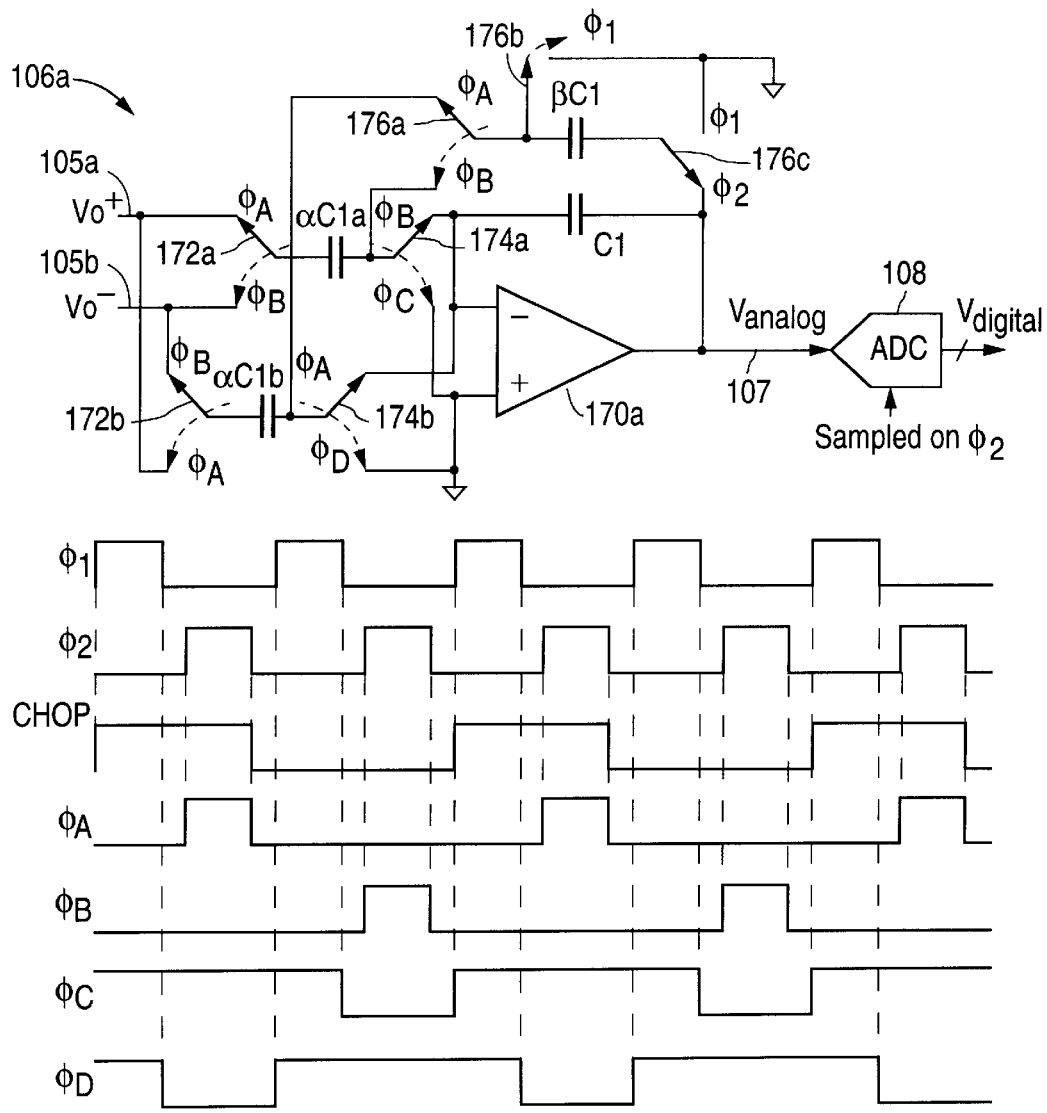
FIG. 9 is a schematic diagram and associated signal timing diagram for a switched-capacitor cosine filter circuit in accordance with one embodiment of the present invention.

Referring to FIG. 9, one embodiment 106a of the cosine filter circuit 106 (FIG. 5) can be implemented as shown. Four additional switch control signals $\phi A$, $\phi B$, $\phi C$, $\phi D$ are used, along with the original CHOP signal and clock signals $\phi 1$ and $\phi 2$. The operational amplifier 170a has a grounded noninverting input terminal and an inverting input terminal which is coupled to its output terminal by a feedback capacitor C1. An additional feedback capacitor βC1 and input capacitors αC1a, αC1b are switched using switches 172a, 172b, 174a, 174b, 176a, 176b, 176c in accordance with the control signals $\phi 1$, $\phi 2$, $\phi A$, $\phi B$, $\phi C$, $\phi D$. For example, when signals $\phi 2$, $\phi A$ and $\phi C$ are asserted (i.e., at a logic high), the noninverse input signal Vo+ (at terminal 105a) is capacitively coupled to circuit ground with capacitor C1a and to the inverting input terminal of the operational amplifier 170 a with capacitor αC1b and feedback capacitors C1, βC1 are connected in parallel. (During assertion of signal $\phi 1$, feedback capacitor βC1 is discharged.)

With the switched-capacitor integrator circuit 104 of FIG. 7 providing the input signals 105a, 105b for the switched-capacitor cosine filter circuit 106a of FIG. 9, the overall transfer function is defined by Equation (3).

$$H(z^{-1}) = \frac{2 \cdot \alpha(1+z^{-1})}{(1+\beta)-z^{-1}} \quad \text{if } \alpha C1a = \alpha C1b \equiv \alpha C1 \quad (3)$$

The operation of the switched-capacitor cosine filter circuit 106a of FIG. 9 can be explained as follows. For purposes of this discussion, it is assumed that the offset of the preceding stage, i.e., the switched-capacitor integrator circuit 104 of FIG. 7, is positive with respect to the output common mode voltage of such circuit 104 during the relevant clock signal phase ($\phi$A, $\phi$B, $\phi$C, $\phi$D).

During clock phase $\phi$A, input capacitor $\alpha$C1a is used to sample the noninverting input signal Vo+ as noninverting integrator. Subsequently, during clock phase $\phi$B, capacitor $\alpha$C1a is used to sample the inverting input signal Vo- as an inverting integrator. It should be understood that during clock phase $\phi$B the chopper clock signal CHOP has switched states and the offset of the integrator circuit 104 has now become negative. Therefore, the offset sampled during clock phase $\phi$B by capacitor $\alpha$C1a at the inverting output terminal 105b will be positive with respect to the output common mode voltage of the preceding stage 104.

Based upon the foregoing, an important sequence of events should be evident. Input capacitor $\alpha$C1a is used to sample the noninverse signal Vo+ as a noninverting integrator and sample the inverse signal Vo- (delayed by one clock cycle) as an inverting integrator, plus capacitor $\alpha$C1a receives the positive offset value during both sampling signal phases. Accordingly, the offset voltage received by capacitor $\alpha$C1a is the same during both clock signal phases and, therefore, does not cause a charge transfer event for capacitor $\alpha$C1a.

Similarly, capacitor $\alpha$C1b is used to sample the noninverse signal Vo+ as a noninverting integrator and sample the inverse signal Vo- (delayed by one clock cycle) as an inverting integrator, plus capacitor $\alpha$C1b receives the negative offset voltage during both sampling signal phases. Accordingly, the offset voltage received by capacitor $\alpha$C1b is the same during both clock signal phases and, therefore, does not cause a charge transfer event for capacitor $\alpha$C1b.

One advantage of this circuit implementation is that cancellation of the DC offset voltage from the preceding stage 104 does not depend upon the matching between capacitors $\alpha$C1a and $\alpha$C1b. Rather, cancellation of the offset depends upon the error, if any, of the RC switch time constant at the end of the clock signal phases.

Any remaining residual error is then due to the offset from the operational amplifier 170a within the cosine filter circuit 106a. Any such error is amplified by the ratio of the capacitors ($\alpha$C1/$\beta$C1+1) For example, with five millivolts (mV) of offset in the operational amplifier 170a this residual error is less than ¼ of an LSB. It should also be understood that since the duty cycles of clock signals $\phi$A and $\phi$B are each 25 percent, this circuit 106a can also be used, without modification, if the switched-capacitor integrator circuit 104 of FIG. 7 is reconfigured as a "double-sampled" integrator circuit.

Based on the foregoing, it should be understood that using chopper stabilization combined with a switched-capacitor cosine filter significantly improves offset of the overall filter circuit, even if no further correction techniques are applied. With reduced offsets, less time is required by the system to settle, thereby reducing the overhead time needed for a system to acquire offset when powering up. Additionally, the use of the cosine filter prevents any spurious frequency components from being introduced into the filter output spectrum that might degrade overall receiver performance.

Figure 9A:
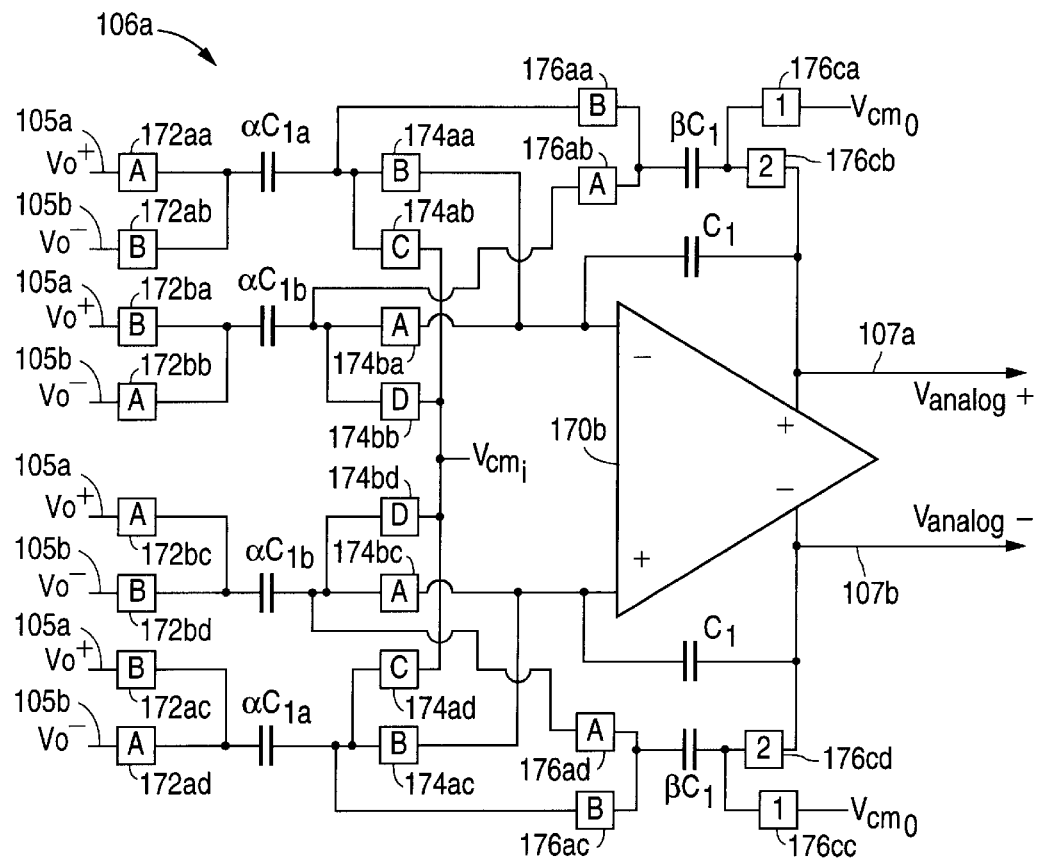
FIG. 9A is a schematic diagram for a fully differential switched-capacitor cosine filter circuit in accordance with another embodiment of the present invention.

Referring to FIG. 9A, another embodiment 106b of the cosine filter circuit 106 (FIG. 5) can be implemented as shown. Unlike the embodiment 106a of FIG. 9 in which a single-ended output signal 107 is provided, this implementation is fully differential and provides a differential output signal 107a/107b. This circuit 106b includes an operational amplifier 170b with a differential output and uses the same input capacitors $\alpha$C1a, $\alpha$C1b, feedback capacitors C1, PC1, switch control signals $\phi$A, $\phi$B, $\phi$C, $\phi$D, CHOP signal and clock signals $\phi$1, $\phi$2 (per timing diagram portion of FIG. 9). A portion of the switched-capacitor input circuit is connected to an input common mode bias potential Vcmi (e.g., circuit ground) and portions of the switched-capacitor feedback circuit are connected to an output common mode bias potential Vcmo (e.g., circuit ground). The switching elements (e.g., pass transistors, transmission gates or other well known switching circuits) are represented in the form of boxes with the designators "1," "2 ," "A," "B," "C" and "D" and function as switches which are closed during the assertion, or logical high state, of signals $\phi$1, $\phi$2, $\phi$A, $\phi$B, $\phi$C, $\phi$D, respectively, and open otherwise Hence, just as the circuit 106 a of FIG. 9, this circuit 106b samples the inverse 105b and noninverse 105 a differential input signal phases as a noninverting integrator circuit during one state of such signals $\phi$1, $\phi$2, $\phi$A, $\phi$B, $\phi$C, $\phi$D, and as an inverting integrator circuit during another state of such signals $\phi$1, $\phi$2, $\phi$A, $\phi$B, $\phi$C, $\phi$D.

Figure 1:
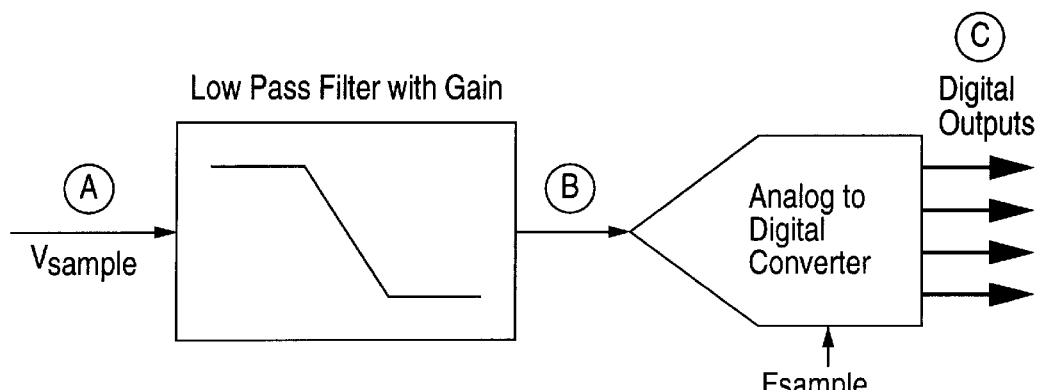
FIG. 1 is a functional block diagram of a conventional digital communication system receive signal path with low pass filtering and analog-to-digital conversion.
Figure 2:
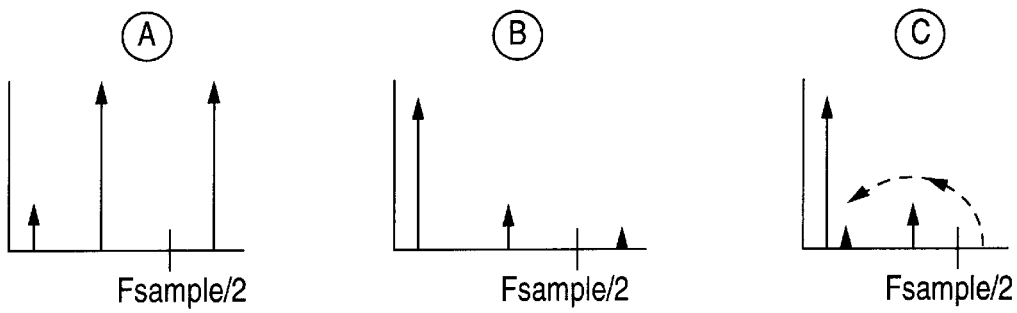
FIG. 2 is a series of signal spectrum representations illustrating signal aliasing for the circuit of FIG. 1.
Figure 3:
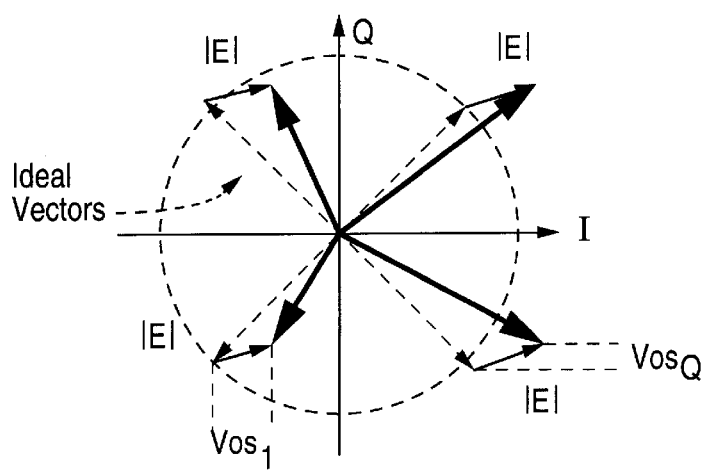
FIG. 3 is a QPSK constellation diagram showing offset errors for the circuit of FIG. 1.
Figure 4:
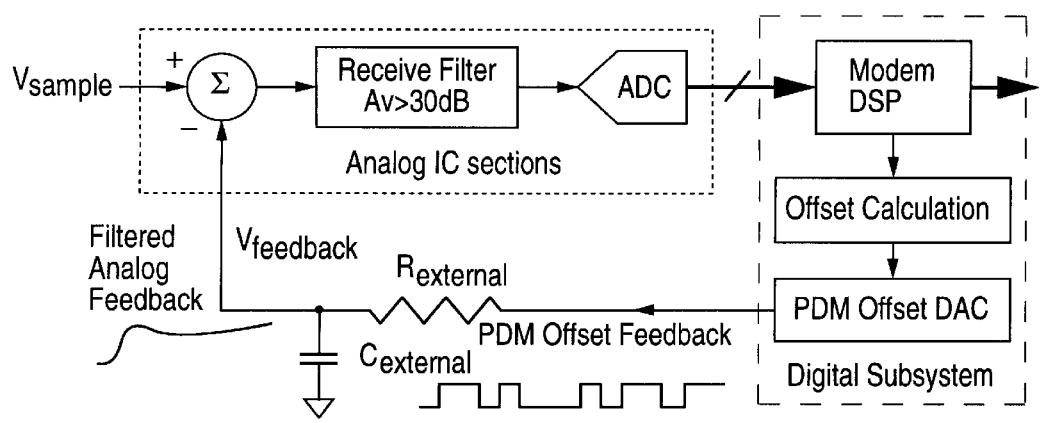
FIG. 4 is a functional block diagram of a conventional offset compensation loop for use with the circuit of FIG. 1.
Figure 10:
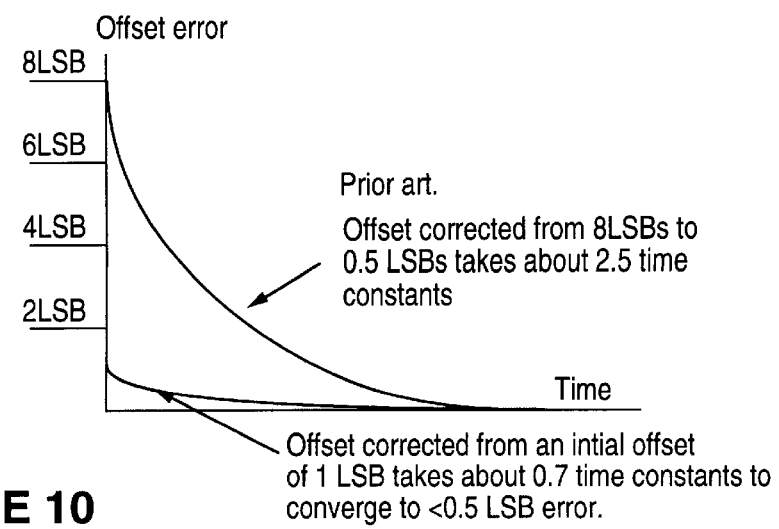
FIG. 10 illustrates the difference in convergence time between a conventional compensation feedback loop and one embodiment of a compensation feedback loop using the present invention.

Referring to FIG. 10, with a chopper-stabilized operational amplifier, the switched-capacitor filter output offset is reduced to within +/-1 LSB with a relatively fast time constant set by the receive filter bandwidth (e.g., 630 kHz). This "coarse" offset correction provided by the chopper stabilization occurs within less than 10 microseconds. (With one conventional receive filter circuit, the initial offset can be equal to or greater than eight LSBs.) When such a chopper-stabilized filter circuit is combined with a cosine filter circuit, as discussed above, the offset compensation occurs in approximately 0.5 time constants as compared to 2.5 time constants with the conventional circuit. (The time constant of the external RC filter network (FIG. 4) is fixed in accordance with the bandwidth of the subject baseband signal.)

Figure 11:
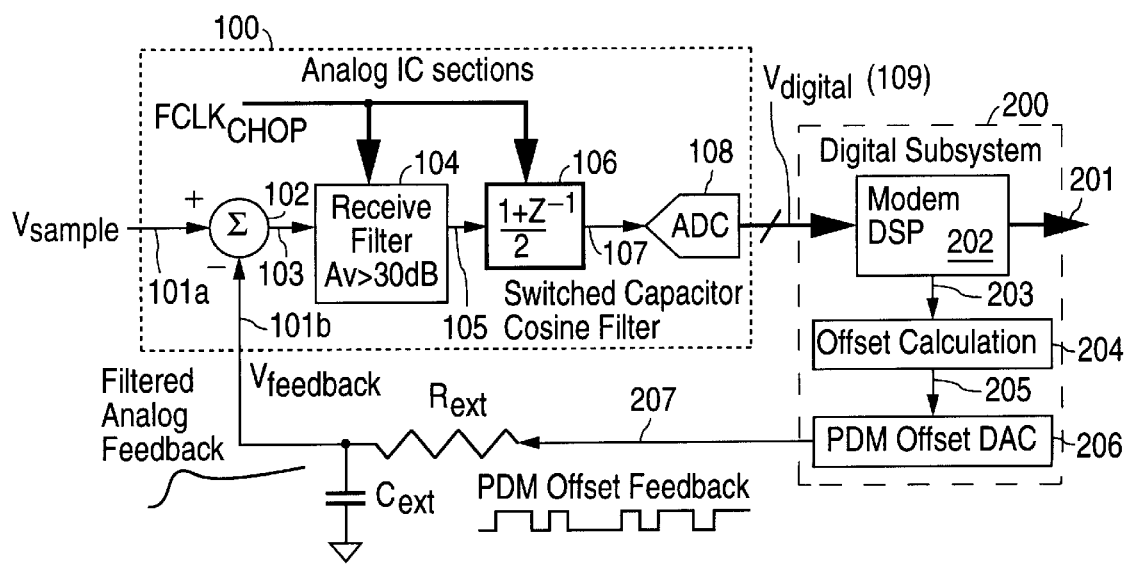
FIG. 11 is a functional block diagram of an offset compensation technique for a digital communications receiver using the present invention.

Referring to FIG. 11, the switched capacitor filter circuit having reduced offsets and providing offset compensation when used in a closed feedback loop includes the switched capacitor filter circuit 100 (FIG. 5) connected in a feedback loop with a digital subsystem 200. The subsystem 200 includes a digital signal processor (DSP) 202, such as that used in a MODEM, which processes the digital output signal 109 to produce a processed digital signal 201. The DSP 202 also produces a digital feedback signal 203 from which an offset calculation circuit 204 determines the magnitude of any offset present in the input digital signal 109. A signal 205 representing the calculated offset is used to produce a PDM signal with a digital-to-analog convertor (DAC) 206. The resulting analog PDM signal is filtered with a low pass filter circuit to produce the feedback signal 101 b for the signal summation circuit 102. As discussed above, the circuit settles significantly faster than conventional designs due to the significantly reduced offsets produced by the filter circuit 100.

Figure 12:
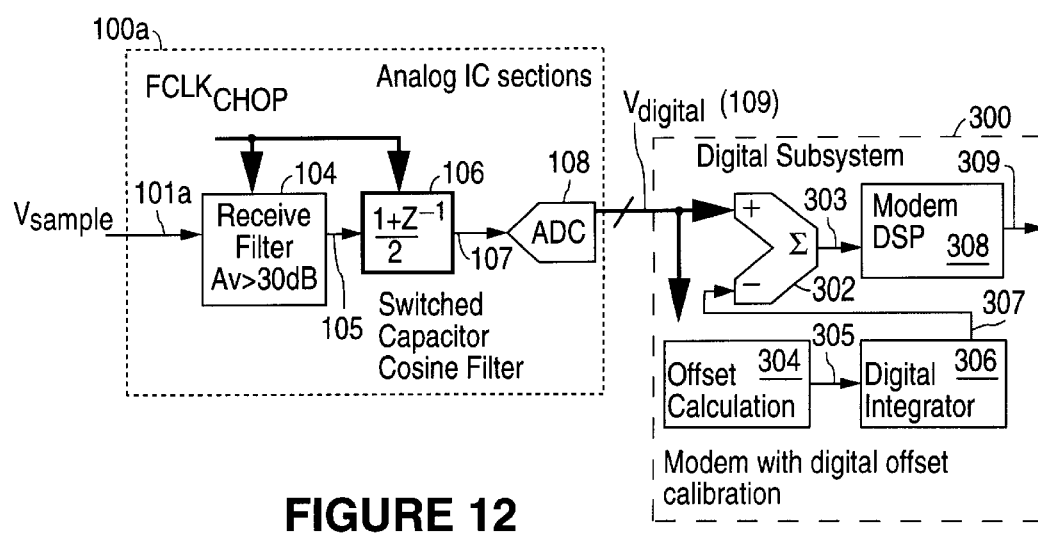
FIG. 12 is a functional block diagram of an offset compensation technique for a digital communications receiver using the present invention.

Referring to FIG. 12, with the offset produced by the filter circuit 100 being significantly reduced, as compared to the conventional designs, a modified filter circuit 100a can be used in which the signal summation circuit 102 is omitted since no feedback signal 101b is required. Instead, the digital subsystem 300 can compensate for any offsets while operating strictly in a digital domain.

In this embodiment, an offset calculation circuit 304 within the digital subsystem 300 computes the amount of offset contained within the digital input signal 109 from the filter circuit 100a. A signal 305 representing this computed offset is integrated using a digital integrator circuit 306. The resulting digital integrated signal 307 is differentially added with the original digital signal 109 in an adder circuit 302. The resulting sum signal 303 is then processed by a DSP 308 to produce a processed signal 309 as desired.

The digital integrator 306 can be implemented with a counter and implements a low pass filter type of function. For example, if the "unity gain" frequency of the digital integrator 306 is set equal to the inverse of the product of the external resistance Rext and capacitance Cext of the low pass feedback filter in the circuit of FIG. 11, the dynamic performance of the loop in the circuit of FIG. 12 will be equivalent to the dynamic performance of the circuit of FIG. 11. This all-digital implementation of an offset compensation loop has the further advantage of a "perfect memory" between power-up cycles of the system, such as those which occur during alternating active and standby modes of operation.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a switched-capacitor cosine filter circuit, comprising:
    inverse and noninverse signal input terminals for conveying inverse and noninverse phases of a differential input signal, respectively;
    a differential amplifier with first and second input terminals and at least one output terminal that in response to first and second input signals provide at least one output signal, respectively;
    a switched-capacitor feedback circuit, coupled between said at least one output terminal and at least one of said first and second input terminals, that in response to a plurality of control signals capacitively couples each one of said at least one output terminal individually to a respective one of said at least one of said first and second input terminals; and
    a switched-capacitor input circuit, coupled between said inverse and noninverse signal input terminals and said at least one of said first and second input terminals, that in response to a first portion of said plurality of control signals alternately capacitively couples said inverse and noninverse signal input terminals and said at least one of said first and second input terminals;
    wherein
    during a first state of said plurality of control signals, said switched-capacitor cosine filter circuit samples said inverse and noninverse differential input signal phases as a noninverting integrator circuit, and
    during a second state of said plurality of control signals, said switched-capacitor cosine filter circuit samples said inverse and noninverse differential input signal phases as an inverting integrator circuit.

2. The apparatus of claim 1, wherein said first portion and a second portion of said plurality of control signals have first and second control signal frequencies, respectively, and said first control signal frequency is a multiple of said second control signal frequency.

3. The apparatus of claim 1, wherein said differential input signal comprises a chopped signal which is synchronized with said plurality of control signals.

4. The apparatus of claim 1, further comprising a signal sampling circuit, coupled to said switched-capacitor cosine filter circuit, that following reception thereof samples said at least one output signal.

5. The apparatus of claim 4, wherein said signal sampling circuit comprises a clocked analog-to-digital conversion circuit.

6. An apparatus including a switch-capacitor cosine filter circuit, comprising:
    a switched-capacitor circuit that in response to a plurality of control signals receives and capacitively couples an input signal and an output signal to provide a switched input signal alternately corresponding to one of said capacitively coupled input and output signals; and
    a differential amplifier, coupled to said switched-capacitor circuit, that following reception of said switched input signal provides said output signal;
    wherein
    during a first state of said plurality of control signals, said switched-capacitor cosine filter circuit samples said input signal as a noninverting integrator circuit, and
    during a second state of said plurality of control signals, said switched-capacitor cosine filter circuit samples said input signal as an inverting integrator circuit.

7. The apparatus of claim 6, wherein said input signal comprises a differential signal.

8. The apparatus of claim 6, wherein first and second portions of said plurality of control signals have first and second control signal frequencies, respectively, and said first control signal frequency is a multiple of said second control signal frequency.

9. The apparatus of claim 6, wherein said input signal comprises a chopped signal which is synchronized with said plurality of control signals.

10. The apparatus of claim 6, further comprising a signal sampling circuit, coupled to said switched-capacitor cosine filter circuit, that following reception thereof samples said output signal.

11. The apparatus of claim 10, wherein said signal sampling circuit comprises a clocked analog-to-digital conversion circuit.

12. A method which includes switching a plurality of capacitors to cosine filter a signal, comprising the steps of:
    conveying via inverse and noninverse signal input terminals a differential input signal with inverse and noninverse input signal phases, respectively;
    receiving first and second input signals with first and second input terminals, respectively;
    differentially amplifying said first and second input signals at said first and second input terminals and generating at least one output signal at at least one output terminal;
    receiving a plurality of control signals;
    capacitively coupling each one of said at least one output terminal individually to a respective one of said at least one of said first and second input terminals in response to said plurality of control signals; and alternately capacitively coupling said inverse and noninverse signal input terminals and said at least one of said first and second input terminals in response to a portion of said plurality of control signals;

wherein during a first state of said plurality of control signals, said inverse and noninverse differential input signal phases are sampled as part of a noninverting signal integration, and during a second state of said plurality of control signals, said inverse and noninverse differential input signal phases are sampled as part of an inverting signal integration.

13. The method of claim 12, wherein:

said step of receiving a plurality of control signals comprises the step of receiving a plurality of control signals with first and second portions having first and second control signal frequencies, respectively; and said first control signal frequency is a multiple of said second control signal frequency.

14. The method of claim 12, wherein said step of conveying via inverse and noninverse signal input terminals a differential input signal with inverse and noninverse input signal phases, respectively, comprises the step of conveying a chopped signal which is synchronized with said plurality of control signals.

15. The method of claim 12, further comprising the step of sampling said at least one output signal.

16. The method of claim 15, wherein said step of sampling said at least one output signal comprises the step of converting an analog signal to a synchronous digital signal.

17. A method which includes switching a plurality of capacitors to cosine filter a signal, comprising the steps of:

receiving an input signal;

receiving a plurality of control signals;

capacitively coupling said input signal and an output signal in response to said plurality of control signals and generating a switched input signal; and receiving said switched input signal and generating said output signal with a differential amplifier;

wherein during a first state of said plurality of control signals, said input signal is sampled as part of a noninverting signal integration, and during a second state of said plurality of control signals, said input signal is sampled as part of an inverting signal integration.

18. The method of claim 17, wherein said step of receiving an input signal comprises the step of receiving a differential signal.

19. The method of claim 17, wherein:

said step of receiving a plurality of control signals comprises the step of receiving a plurality of control signals with first and second portions having first and second control signal frequencies, respectively; and said first control signal frequency is a multiple of said second control signal frequency.

20. The method of claim 17, wherein said step of receiving an input signal comprises the step of receiving a chopped signal which is synchronized with said plurality of control signals.

21. The method of claim 17, further comprising the step of sampling said output signal.

22. The method of claim 21, wherein said step of sampling said output signal comprises the step of converting an analog signal to a synchronous digital signal.

* * * * *